United States Patent
Ziegler

(10) Patent No.: US 6,218,687 B1
(45) Date of Patent: Apr. 17, 2001

(54) SMART MICROSENSOR ARRAYS WITH SILICON-ON-INSULATOR READOUTS FOR DAMAGE CONTROL

(75) Inventor: John Paul Ziegler, San Diego, CA (US)

(73) Assignee: General Atomics, San Diego, CA (US)

( * ) Notice: Subject to any disclaimer, the term of this patent is extended or adjusted under 35 U.S.C. 154(b) by 0 days.

(21) Appl. No.: 09/217,497

(22) Filed: Dec. 21, 1998

(51) Int. Cl.[7] .................................................. H01L 29/82
(52) U.S. Cl. ....................... 257/253; 257/254; 257/414; 257/415; 438/52; 438/54; 73/723; 73/727; 73/514.16; 204/430; 204/431
(58) Field of Search ................... 257/252, 253, 257/254, 414, 415, 417, 420, 418; 438/49, 50, 52, 54; 73/727, 723, 720, 718, 514.16; 204/430, 431

(56) References Cited

U.S. PATENT DOCUMENTS

| 4,502,938 | * | 3/1985 | Covington et al. | 204/412 |
|---|---|---|---|---|
| 4,907,441 | | 3/1990 | Shurmer | 73/23 |
| 4,993,143 | * | 2/1991 | Sidner et al. | 29/621.1 |
| 5,068,813 | | 11/1991 | Thoen | 364/572 |
| 5,163,329 | * | 11/1992 | Shimaoka et al. | 73/721 |
| 5,278,774 | | 1/1994 | Wilson | 364/507 |
| 5,349,541 | | 9/1994 | Alexandro, Jr. et al. | 364/578 |
| 5,414,645 | | 5/1995 | Hirano | 364/551.01 |
| 5,419,197 | | 5/1995 | Ogi et al. | 73/659 |
| 5,481,481 | | 1/1996 | Frey et al. | 364/551.01 |
| 5,545,912 | * | 8/1996 | Ristic et al. | 257/417 |
| 5,910,765 | | 6/1999 | Slemon et al. | 340/517 |
| 5,929,497 | * | 7/1999 | Chavan et al. | 257/417 |
| 6,011,273 | * | 1/2000 | Ichikawa et al. | 257/57 |
| 6,028,331 | * | 2/2000 | Mastromatteo et al. | 257/253 |
| 6,028,343 | * | 2/2000 | Chan et al. | 257/417 |

FOREIGN PATENT DOCUMENTS

| 0 632 268 A1 | | 1/1995 | (EP) . |
|---|---|---|---|
| 410148624 | * | 6/1998 | (JP) . |

OTHER PUBLICATIONS

Persaud, Krishna C, *Electronic Gas and Odour Detectors that Mimic Chemoreception in Animals*, (7 pages), Feb., 1992, Manchester, UK.

Shurmer, H.V., *An Electronic Nose: A Sensitive and Discriminating Substitute for a Mammalian Olfactory System*, IEE Proceedings, vol. 137, Pt. G, No. 3, pp. 197–204, Jun. 1990.

* cited by examiner

Primary Examiner—William Mintel
(74) Attorney, Agent, or Firm—Nydegger & Associates

(57) ABSTRACT

A microsensor for identifying a change in a characteristic of an environment having temperatures of up to approximately five hundred degrees Centigrade includes a substantially flat insulator layer made of silicon oxide. A base layer made of silicon is integrally attached to one side of the insulator layer and a support layer is integrally attached to the other side of the insulator layer. Together the base layer and the support layer stabilize the support layer which is only about one thousand angstroms thick. A sensor element is mounted on the exposed surface of the support layer, and opposite the insulator layer, to generate a signal in response to the change in the environmental characteristic. Additionally, there is an electronic element which is processed into the support layer. This electronic element is electrically connected directly with the sensor element to process the signal and indicate an appropriate response.

14 Claims, 2 Drawing Sheets

Figure 2A Figure 2B

SMART MICROSENSOR ARRAYS WITH SILICON-ON-INSULATOR READOUTS FOR DAMAGE CONTROL

FIELD OF THE INVENTION

The present invention pertains generally to electronic/chemical/biological sensors. More particularly, the present invention pertains to electronic/chemical/biological microsensors which are capable of reliable operation at elevated temperatures of at least three hundred degrees Centigrade and most likely up to approximately five hundred degrees Centigrade. The present invention is particularly, but not exclusively useful as a microsensor with associated electronics which can be mounted on a so-called silicon-on-insulator substrate in either monolithic or hybrid configurations.

BACKGROUND OF THE INVENTION

The use of silicon as a substrate for integrated circuits and other high technology electronics is well known and has been an acceptable manufacturing material for many years. Specifically, it is well known that silicon lends itself to plasma etching and deposition processes as well as many other well known application techniques which are useful and necessary for the manufacture of miniaturized electronic circuitry. Further, it is also well known that although silicon is capable of operating in elevated temperature environments, it also happens that the performance of a silicon device is significantly degraded at elevated temperatures. For example, to name but a few, it is known that at elevated temperatures silicon will exhibit lower mobility, lower transconductance, higher power consumption, lower threshold voltage, higher junction leakage current and higher metal line resistance. In turn, these problems lead to excess power consumption, degradation of logic levels in electronic components, and degraded noise margin. Further, at elevated temperatures, silicon is also susceptible to what is commonly referred to in the industry as "cross-talk" (i.e. interference that is caused by energy from one signal invading another circuit by electrostatic or electromagnetic coupling). Obviously, the problems set forth above that are directly associated with operation in elevated temperature environments are to be avoided. This is so due to the fact many environments are susceptible to elevated temperatures and need to be effectively monitored. Damage control in ships, aircraft, trains and buildings is a prime example of the need for such monitoring.

It is known that many of the problems which are associated with electronic/chemical/biological sensors can either be minimized or entirely eliminated, if a proper substrate is chosen. The selection of a proper substrate material, however, requires more than the ability of the substrate to tolerate high temperatures. Clearly, many materials which have excellent tolerance of elevated temperatures do not have the other qualities which are necessary for their use as a substrate for electronic circuits. As indicated above, despite recognized shortcomings, silicon has very good operating characteristics and, as also indicated above, silicon is a material which has been widely used in the fabrication of many different electronic circuitry devices. With all of the above in mind, it has been recognized that silicon can still be used, and its susceptibility to diminished performance at elevated temperatures can be minimized, by mounting sensors and their associated electronic circuitry on very thin layers of silicon. Specifically, recent processes have been developed which allow for the fabrication of nearly pure silicon layers that are on the order of only about one thousand to two thousand angstroms in thickness.

In light of the above it is an object of the present invention to provide a microsensor with associated electronics for identifying changes in the magnitude of an environmental characteristic (e.g. temperature, gas concentration, and pressure) when the temperature of the environment is up to as high as in a range of three hundred to five hundred degrees centigrade. Another object of the present invention is to provide a microsensor with associated electronics which will accurately interpret changes in environmental characteristics that occur at elevated temperatures. It is another object of the present invention to provide a microsensor for identifying a change in an environmental characteristic which can do so with minimal power loss, minimal current leakage and minimal cross-talk. Still another object of the present invention is to provide a high temperature active microsensor which incorporates electronic circuitry that can be manufactured using standard manufacturing processes. Another object of the present invention is to provide a microsensor for identifying a change in an environmental characteristic at a temperature up to approximately three or five hundred degrees Centigrade which is simple to use, relatively easy to manufacture, and comparatively cost effective.

SUMMARY OF THE PREFERRED EMBODIMENTS

In accordance with the present invention, a high temperature "smart" microsensor for identifying changes of environmental characteristics in an environment is provided. For purposes of the present invention, the descriptor "smart" shall be taken to mean that the sensor is associated with electronics which will record, evaluate and interpret the signal(s) which are generated by the sensor element(s). Importantly, the sensor element and its associated electronics are intended to be capable of providing information and initiating responsive actions which are necessary for reacting to an elevated temperature environment.

In detail, a "smart" microsensor in accordance with the present invention includes an insulated substrate. Specifically, for the microsensor of the present invention this insulated substrate includes a substantially flat insulator layer that is sandwiched between a base layer and a support layer. Importantly, the support layer, which is integrally attached to the top side of the insulator layer, has a thickness that is, preferably, in the range of about one thousand to two thousand angstroms. On the other hand, the thickness of the insulator layer will be on the order of about four thousand angstroms. The base layer, which is integrally attached to the bottom side of the insulator layer (i.e. on the side of the insulator layer that is opposite the support layer) can be considerably thicker than either the support layer or the insulator layer and is intended to provide a structural base for the complete device. Preferably, the base layer and the support layer are both made of silicon while the insulator layer, which is located between these two layers, is made of an oxide, such as silicon oxide ($SiO_2$).

For the operational components of the present invention, a sensor element is mounted on the exposed surface of the support layer of the insulated substrate. For one embodiment of the present invention, the sensor element can be mounted along with the an electronic element (e.g. microprocessor) on the support layer to create a monolithic device. Alternatively, a sensor element and its associated electronics can be mounted on separate substrates to create a hybrid device. As contemplated for the present invention, the sensor element may be any of several types well known in the pertinent art, and may include electronic sensors, chemical sensors, or biological sensors, as well as sensors specifically designed to detect temperature or pressure. For example, sensor elements suitable for use with the present invention may be devices such as Metal Oxide Semiconductor Field Effect Transistors (MOSFET), ChemFETs, ceramic metallic cells (Cermets), strain gauges, or semiconductor devices such as ring oscillators.

Common to all of the sensor elements that may be used for the present invention is the fact that at least one electronic element is associated with the sensor element. Specifically, this electronic element is designed to receive a signal(s) from the sensor element that is indicative of a change in the environment that is being monitored. The electronic element will then evaluate the signal (perhaps together with signals received from other sensors) and interpret the signal(s). In this respect, the combined capabilities of the electronic element and the sensor element establish a "smart" sensor. As indicated above the electronic element can either be mounted on the exposed surface of the substrate's support layer (monolithic device) or, alternatively, mounted on a separate substrate (hybrid device). In either case they cooperate with each other.

It is contemplated for the present invention that signal processing by the electronic element will include the comparison and interpretation of signals which will lead to the completion of decision making tasks. An alarm or responsive action can then be generated whenever required. For example, the sensors may sense gases from an incipient fire, generate an order to turn on sprinklers in response to this event, then sense when the fire is out and, subsequently, turn off the sprinklers. Other, similar type, routines are also contemplated.

It is an important consideration of the present invention that the microsensor and its associated electronic element be able to properly function in elevated temperature environments. Specifically, due to the particular structure of the substrate, and more specifically due to the thinness of the support layer (i.e. less than about two thousand angstroms) the effects of ionizing radiation and thermal reactions are significantly reduced. Indeed, temperatures up to approximately three hundred degrees Centigrade can be tolerated by the microsensor of the present invention. With process modification, temperatures of up to five hundred degrees Centigrade may be tolerated.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which:

FIG. 2A is a perspective view of a bulk silicon wafer;

FIG. 2B is a perspective view of the silicon wafer in FIG. 2A after it has been processed to create a silicon-on-insulator (SOI) combination;

DESCRIPTION OF THE PREFERRED EMBODIMENT

Figure 1:
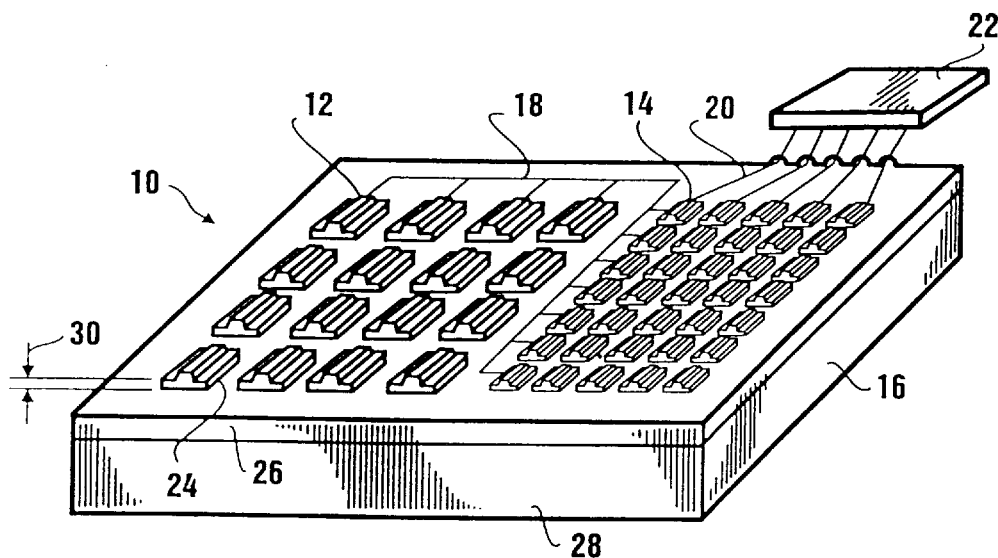
FIG. 1 is a perspective view of the microsensor device of the present invention.

Referring initially to FIG. 1, a microsensor device in accordance with the present invention is shown and generally designated 10. As shown, the device 10 includes at least one sensor element 12, and at least one electronic element 14. Both the sensor element 12 and the electronic element 14 can be processed into a common substrate 16 as shown in FIG. 1 to create a monolithic device. It will be appreciated by the skilled artisan that, alternatively, the sensor element 12 and the electronic element 14 may alternatively be processed into separate substrates 16 to create a hybrid device. Further, it will be appreciated by the skilled artisan that several electronic elements 14 can be combined to make a so-called "readout" circuit. The exact incorporation of electronic elements 14 in such a readout circuit is generally a matter of design choice.

As shown in FIG. 1, an electrical connector 18 is provided which connects the sensor element 12 with the electronic element 14, and an electrical connector 20 connects the electronic element 14 with a data link 22. For purposes of disclosure here, the electrical connector 18 is merely illustrative. As a practical matter, and as is well known in the pertinent art (e.g. where a MOSFET is used for sensor element 12), the electrical connector 18 will include at least three contacts; one for the source, another for the gate, and a third for the drain. Additionally, a backside contact is often provided. In any event, through these connectors 18, 20, the sensor element 14 is interconnected with the data link 22 so that signals which are generated by the sensor element 12 can be properly evaluated by the electronic element 14 and passed through the data link 22 to stations (not shown) where the generated signal can be further interpreted and used. As will be appreciated by the skilled artisan, the connectors 18 and 20 can be in any of several arrangements which will satisfy the particular design requirements of the device 10.

In detail, the substrate 16 includes a plurality of layers. These are; as shown in FIG. 1, a support layer 24 on which the sensor element 12 and the electronic element 14 may be processed, an insulator layer 26, and a base layer 28. For purposes of the present invention both the support layer 24 and the base layer 28 are preferably made of silicon. Other suitable materials, however, may be used in lieu of silicon such as, glass or quartz. Sapphire may also a suitable material for the present invention. The insulator layer 26 that is between the support layer 24 and the base layer 28, however, is preferably silicon oxide ($SiO_2$).

Figure 2C:
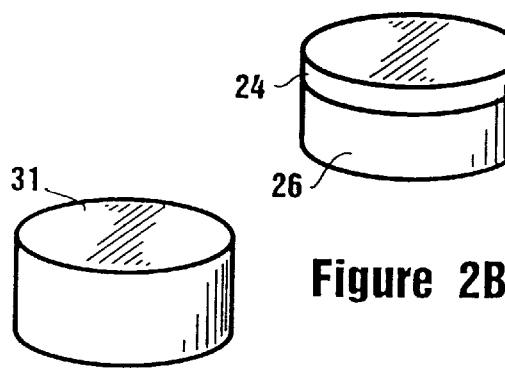
FIG. 2C is a perspective view of the SOI combination shown in FIG. 2B mounted on a support to create an SOI substrate.
Figure 2C:
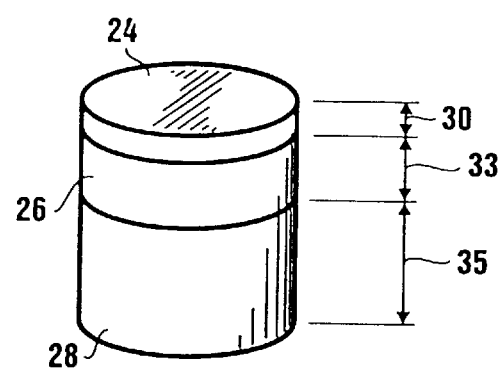

In the manufacture of the substrate 16, a bulk silicon wafer can be used and the insulator layer 26 can be created using oxygen implant or plasma implant technology. For the present invention, this insulator layer 26 will have a thickness on the order of about four thousand angstroms. The result is a silicon-on-insulator (SOI) structure in which the support layer 24 can be made extremely thin. Importantly, once the insulator layer 26 has been created it is essential that the resultant support layer 24 have a thickness 30 which is less than about two thousand angstroms. Preferably, the thickness 30 will be on the order of about one thousand angstroms. FIGS. 2A, 2B and 2C, illustrate one way in which an SOI substrate 16 can be manufactured. This particular exemplary process begins with a bulk silicon wafer 31 as shown in FIG. 2A. This wafer 31 is then either processed as indicated above, or an oxide is formed on the wafer to create the silicon-oxide combination which includes the support layer 24 and the insulator layer 26 shown in FIG. 2B. This combination is then bonded or mounted onto a base layer 28 (FIG. 2C). Once the support layer 24, insulator layer 26 and base layer 28 have been bonded together as shown in FIG. 2B, the support layer 24 can be thinned (if not already done so) in a manner well known in the art, such as by thermal initiated cleavage. The result is an SOI substrate 16 wherein the thickness 30 of support layer 24 is about one thousand angstroms, the thickness 33 of insulator layer 26 is about four thousand angstroms, and the thickness 35 of base layer 28 varies, but is typically much greater than four thousand angstroms.

Figure 3:
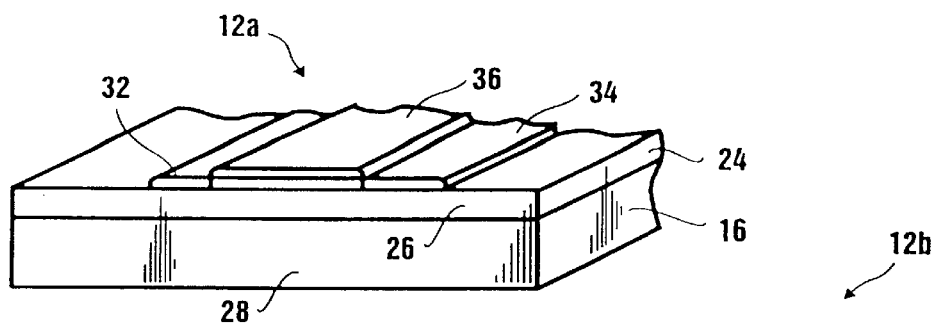
FIG. 3 is a schematic representation of a metal oxide semiconductor field effect transistor which is suitable for use with the present invention.

Referring now to FIG. 3, a schematic view of an exemplary sensor element 12a shows how the sensor element 12a could be configured as a metal oxide semiconductor field effect transistor (MOSFET). Specifically, as shown, such a sensor element 12a includes a source 32, which is often grounded, and a drain 34. Between the source 32 and the drain 34 is a gate 36 which is positioned over a layer 38 of oxide material, e.g. $SiO_2$. As is well known by the skilled artisan, such a MOSFET will function basically as a switch. For instance, by using a catalytic platinum (Pt) or palladium (Pd) gate metal, for the gate 36, gases will be adsorbed from the environment, by the sensor element 12a, which will change the gate work function of the MOSFET. Thus the current-voltage characteristics of the MOSFET (sensor element 12) will be influenced and caused to create a signal. According to the particular electronic element(s) 14 that are associated with the sensor element 12a, the generated signal can be used to detect the presence or concentration of a particular gas.

Figure 4:
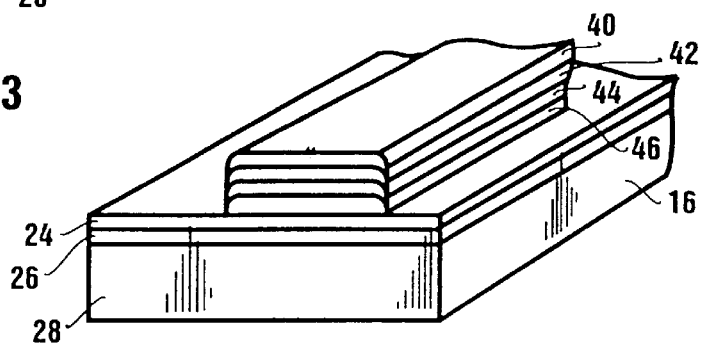
FIG. 4 is a schematic representation of a ceramic metallic cell which is suitable for use with the present invention.

FIG. 4 shows an example of another type sensor element 12. Specifically, in FIG. 4 a cermet sensor element is shown and is generally designated 12b. As the name "cermet" implies, the sensor element 12b is a ceramic metallic cell. Typically, as shown in FIG. 4, a sensor element 12b will include several layers which are stacked on top of the support layer 24 of the substrate 16. These layers are, in order from the most exposed layer down to the support layer 24, a catalytic electrode 40, a solid electrolyte 42, a lower electrode 44 (sometimes referred to as a counter), and a reference layer 46. Together, the layers 40, 42, 44 and 46 will change their functional current-voltage relationship in the presence of an environmental characteristic. More specifically, gases adsorbed on catalytic electrode 40 will cause a chemical reaction to take place which generates a current. Importantly, with this change in current-voltage relationship, a signal is generated which can be used to identify the presence, concentration or general characteristics of gases present near the sensor.

Figure 5:
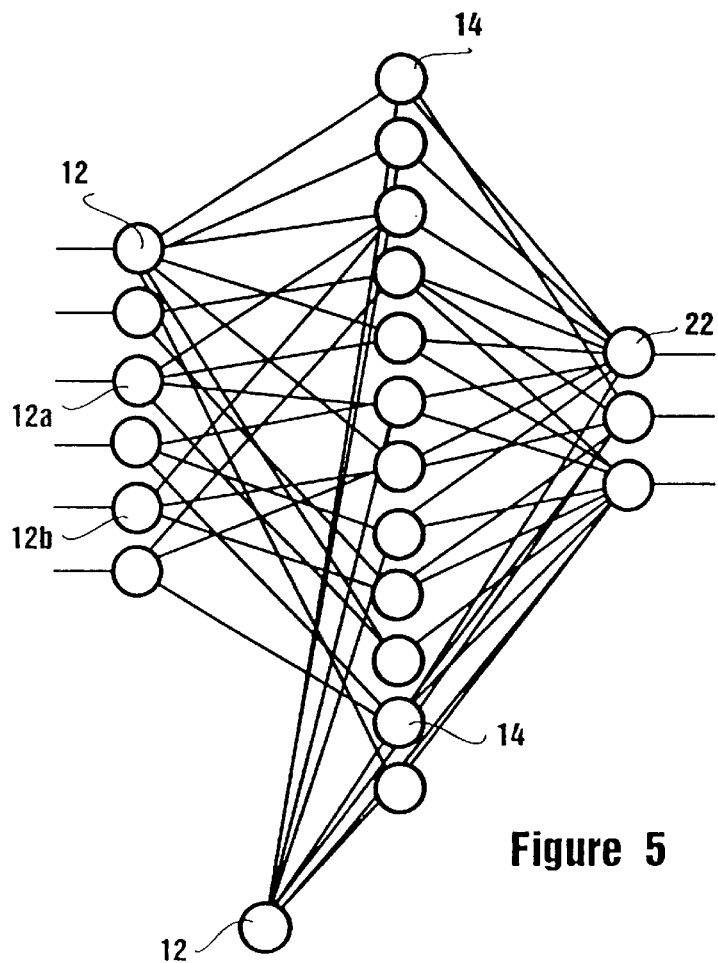
FIG. 5 is a schematic representation of information flow in accordance with the present invention.

The interaction of a sensor element 12 (such as the sensor element 12a or 12b) with the electronic element(s) 14 may best be appreciated by cross referencing FIG. 5 with FIG. 1. From these figures it can be appreciated that the signal(s) generated by a sensor element 12 can be passed to one or more electronic elements 14, and that each electronic element 14 can receive signals from more than one sensor element 12. Accordingly, the electronic elements 14 can interrogate the sensor elements 12 and perform operations such as i) "cyclic voltammetry" on cermet sensor elements 12, ii) resistance measurements on metal-oxide (e.g. $SnO_2$ or $In_2O_3$) sensor elements 12, or iii) frequency measurements on ring oscillator sensor elements 12. From these readings, data can be generated that can be analyzed and passed to a data link 22 for decision making events. Further, this data may be processed with a microcontroller data link 22 on the substrate 16 which can be used to inform other devices or people about what is going on. As intended for the present invention, the decision making processes can be made by microcontrollers, neural networks, or other similar type devices well known in the pertinent art which may be processed on the support layer 24.

While the particular Smart Microsensor Arrays with Silicon-On-Insulator Readouts for Damage Control as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A microsensor for identifying a change in a characteristic of an environment having temperatures below approximately five hundred degrees Centigrade which comprises:

a substantially flat insulator layer, said insulator layer having a first surface and a second surface;

a base layer integrally attached to said insulator layer to cover said second surface thereof to stabilize said insulator layer;

a support layer integrally attached to said insulator layer to cover said first surface thereof, said support layer having an exposed surface;

a plurality of sensor elements processed into said exposed surface of said support layer to generate a respective plurality of signals in response to the change in the environment characteristic; and a plurality of electronic elements, each said electronic element being connected directly with at least one said sensor element to collectively process said signals.

2. A microsensor as recited in claim 1 wherein said support layer is silicon, said insulator layer is silicon oxide, and said base layer is silicon.

3. A microsensor as recited in claim 1 wherein said electronic element is processed into the support layer.

4. A microsensor as recited in claim 1 wherein said sensor element is a cermet.

5. A microsensor as recited in claim 1 wherein said sensor element is a ring oscillator.

6. A microsensor as recited in claim 1 wherein said sensor is a metal oxide.

7. A microsensor as recited in claim 1 wherein said support layer has a thickness between said first layer of said insulator layer and said exposed layer of said support layer, said thickness being approximately one thousand angstroms.

8. A microsensor for identifying a change in a characteristic of an environment having temperatures below approximately five hundred degrees Centigrade which comprises:

a support layer made of silicon having a first surface and a second surface with an edge therebetween, said support layer being substantially flat and having a thickness between said first surface and said second surface of less than approximately two thousand angstroms;

a plurality of sensor elements mounted on said first surface of said support layer to generate a respective plurality of signals in response to the change in the environment characteristic; and a plurality of electronic elements, each said electronic element being connected directly with at least one said sensor element to collectively process said signals.

9. A microsensor as recited in claim 8 further comprising a substantially flat insulator layer made of silicon oxide attached to said support layer to cover said second surface thereof.

10. A microsensor as recited in claim 9 further comprising a base layer integrally attached to said insulator layer opposite said support layer thereon to cover said insulator layer for stabilizing said insulator layer.

11. A microsensor as recited in claim 8 wherein said electronic element is processed into the support layer.

12. A microsensor as recited in claim 8 wherein said sensor element is a cermet.

13. A microsensor as recited in claim 8 wherein said sensor element is a ring oscillator.

14. A microsensor as recited in claim 8 wherein said sensor is a metal oxide.

* * * * *